United States Patent
Kondo et al.

(10) Patent No.: US 10,448,550 B2
(45) Date of Patent: Oct. 15, 2019

(54) TOOL SEARCHING DEVICE

(71) Applicant: FUJI CORPORATION, Chiryu-shi (JP)

(72) Inventors: Tatsue Kondo, Chiryu (JP); Takuya Iwata, Konan (JP); Tsuyoshi Hamane, Toyota (JP); Noriaki Iwaki, Hekinan (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/775,098

(22) PCT Filed: Nov. 25, 2015

(86) PCT No.: PCT/JP2015/083094
§ 371 (c)(1),
(2) Date: May 10, 2018

(87) PCT Pub. No.: WO2017/090131
PCT Pub. Date: Jun. 1, 2017

(65) Prior Publication Data
US 2018/0332745 A1 Nov. 15, 2018

(51) Int. Cl.
*H05K 13/00* (2006.01)
*H05K 13/04* (2006.01)
(Continued)

(52) U.S. Cl.
CPC ......... *H05K 13/0408* (2013.01); *B23B 31/12* (2013.01); *H05K 13/0053* (2013.01);
(Continued)

(58) Field of Classification Search
CPC ........... H05K 13/0408; H05K 13/0404; H05K 13/08; H05K 13/04; H05K 13/0411;
(Continued)

(56) References Cited

U.S. PATENT DOCUMENTS 5,208,976 A * 5/1993 Bess ..................... H05K 13/022
29/702
5,325,305 A * 6/1994 Rezaei ............... G05B 19/4183
700/114

(Continued)

FOREIGN PATENT DOCUMENTS

| JP | 2008-108919 A | 5/2008 |
| JP | 2009-200532 A | 9/2009 |
| JP | 2014-27063 A | 2/2014 |

OTHER PUBLICATIONS

International Search Report dated Feb. 16, 2016, in PCT/JP2015/083094 filed Nov. 25, 2015.

*Primary Examiner* — Ronald D Hartman, Jr.
(74) *Attorney, Agent, or Firm* — Oblon, McClelland, Maier & Neustadt, L.L.P.

(57) ABSTRACT

A chuck main body type and claw type deciding table and a pusher type deciding table are memorized in advance, information related to a leaded component such as component size, lead pitch, lead diameter, and component form is acquired, a combination of the chuck main body type and the claw type is searched from the chuck main body type and claw type deciding table using the acquired component size, lead pitch, lead diameter, and the like as search terms, the pusher is searched from the pusher type deciding table using the acquired component form or the like as a search term, and the search results are displayed. By this, it is possible to automatically select a tool made from a combination of multiple configuration members.

5 Claims, 13 Drawing Sheets

(51) Int. Cl.
*H05K 13/08* (2006.01)
*B23B 31/12* (2006.01)

(52) U.S. Cl.
CPC ......... *H05K 13/04* (2013.01); *H05K 13/0411* (2018.08); *H05K 13/08* (2013.01); *B23B 2231/345* (2013.01)

(58) Field of Classification Search
CPC ........... H05K 13/0452; H05K 13/0482; H05K 3/0008; H05K 3/301; H05K 3/303; H05K 3/00; H05K 3/0015; H05K 3/0053
See application file for complete search history.

(56) References Cited

U.S. PATENT DOCUMENTS

| | | | | |
|---|---|---|---|---|
| 7,712,208 | B2* | 5/2010 | Watanabe | H05K 13/0417 29/740 |
| 2002/0144228 | A1* | 10/2002 | Uchida | G06F 17/5018 716/111 |
| 2009/0205569 | A1* | 8/2009 | Perault | H05K 3/0008 118/713 |
| 2009/0255426 | A1* | 10/2009 | Doyle | B41M 1/12 101/129 |
| 2016/0330880 | A1* | 11/2016 | Morikawa | B23P 19/001 |
| 2016/0330882 | A1* | 11/2016 | Nagata | H05K 13/0404 |
| 2017/0318714 | A1* | 11/2017 | Nishiyama | G05B 15/02 |
| 2018/0011717 | A1* | 1/2018 | Iisaka | H05K 13/0882 |
| 2018/0310444 | A1* | 10/2018 | Hosaka | H05K 13/0409 |
| 2019/0059160 | A1* | 2/2019 | Hagel | C09J 9/02 |

* cited by examiner

FIG. 10

| Chuck main body type and claw type deciding table ||||||||
| Lead quantity N | Component size D2 | Component size D1 | Distance H | Lead pitch F | Lead diameter d | Chuck main body type | Claw type |
|---|---|---|---|---|---|---|---|
| 2 | ① D2≦5 | D1≦10 | H≦30 | F=2.5 | 0.4≦d<0.8 | LCA | LAR025 |
|   |   |   |   |   | Other than above |   | Custom |
|   |   |   |   | F=5 | 0.4≦d<0.8 |   | LAR050 |
|   |   |   |   |   | Other than above |   | Custom |
|   |   |   |   | F=7.5 | 0.4≦d<0.8 |   | LAR075 |
|   |   |   |   |   | Other than above |   | Custom |
|   |   |   | H>30→② | — | — | — | — |
|   |   | 10<D2≦20 | H≦30 | — | — | LCA | Custom |
|   |   |   | H>30→② | — | — | — | — |
|   | ② D2<10 | — | H≦30 | F=2.5 | 0.4≦d<0.6 | LCB | LBR6N025 |
|   |   |   |   |   | 0.6≦d<0.8 |   | LBR8N025 |
|   |   |   |   |   | Other than above |   | Custom |
|   |   |   |   | F=5 | 0.4≦d<0.6 |   | LBR6N050 |
|   |   |   |   |   | 0.6≦d<0.8 |   | LBR8N050 |
|   |   |   |   |   | Other than above |   | Custom |
|   |   |   |   | F=7.5 | 0.4≦d<0.6 |   | LBR6N075 |
|   |   |   |   |   | 0.6≦d<0.8 |   | LBR8N075 |
|   |   |   |   |   | Other than above |   | Custom |
|   |   |   | 30<H≦50 | F=2.5 | 0.4≦d<0.6 |   | HBR6N025 |
|   |   |   |   |   | 0.6≦d<0.8 |   | HBR8N025 |
|   |   |   |   |   | Other than above |   | Custom |
|   |   |   |   | F=5 | 0.4≦d<0.6 |   | HBR6N050 |
|   |   |   |   |   | 0.6≦d<0.8 |   | HBR8N050 |
|   |   |   |   |   | 上記以外 |   | Custom |
|   |   |   |   | F=7.5 | 0.4≦d<0.6 |   | HBR6N075 |
|   |   |   |   |   | 0.6≦d<0.8 |   | HBR8N075 |
|   |   |   |   |   | Other than above |   | Custom |

FIG. 11

| Pusher type deciding table ||||| 
|---|---|---|---|---|
| Distance H | Component type (upper surface form) | Component size D2 | Chuck main body type | Pusher type |
| H<20 | — | | — | Custom |
| 20≦H≦40 | Upper surface is flat | — | LCA | PAH |
| | | | LCB | PBH |
| | Longitudinal resistor | | LCA | PAB |
| | | | LCB | PBB |
| | Round-topped | | LCA | PAD |
| | | | LCB | PBD |
| | Disc-type or film-type | D2≧6 | LCA | PAH |
| | | | LCB | PBH |
| | | D2<6 | LCA | PAC |
| | | | LCB | PBC |

FIG. 12

| Pusher height deciding table ||
|---|---|
| Distance H | Pusher height |
| 20<H≦21 | 0 |
| 21<H≦22 | 1 |
| 23<H≦24 | 2 |
| 24<H≦25 | 3 |
| 25<H≦26 | 4 |
| 26<H≦27 | 5 |
| 27<H≦28 | 6 |
| 28<H≦29 | 7 |
| 29<H≦30 | 8 |
| 30<H≦31 | 9 |
| 31<H≦32 | 10 |

FIG. 13

| Chuck main body type | Claw type | Pusher type | Tool ID |
|---|---|---|---|
| LCB | HBR6N025 | PBH | 7FBHBA |
| | | PBB | 7FBBBA |
| | | PBC | 7FBCBA |
| | | PBD | 7FBDBA |
| | HBR6N050 | PBH | 7FBHCA |
| | | PBB | 7FBBCA |
| | | PBC | 7FBCCA |
| | | PBD | 7FBDCA |
| | HBR6N075 | PBH | 7FBHDA |
| | | PBB | 7FBBDA |
| | | PBC | 7FBCDA |
| | | PBD | 7FBDDA |

FIG. 14

Back  Issue 2D code  Save tool configuration  Clear tool configuration table

| No. | Tool ID | Issue target | Serial number | Chuck main body | Claw | Pusher | Pusher height |
|---|---|---|---|---|---|---|---|
| 1 | 7FBHCA | Yes | 000001 | LCB | HBR6N050 | PBH | 10 |
| 2 | | | | | | | |

FIG. 15

| | Minimum | Maximum |
|---|---|---|
| D | *** | *** |
| d | *** | *** |
| F | *** | *** |

Units: mm

Leaded component chuck selection for axial components

Summary

This selection wizard applies to components listed in the table below. Consult the manufacturer for items not listed in the table below.

Items to prepare

Prepare the target components that are axially taped.
If available, also prepare specification documents for the target components.

The following items and dimensions are required for the wizard.
Enter information by following the wizard.

| Dimension D | Component size |
|---|---|
| Dimension d | Lead diameter |
| F | Lead pitch (pitch of insertion holes) |

Enter

FIG. 16

TOOL SEARCHING DEVICE

TECHNICAL FIELD

The present application relates to a tool searching device.

BACKGROUND ART

Conventionally, there are known component mounters that grip a component with a mechanical chuck (mecha-chuck) and mount the component on a board. For example, in patent literature 1, disclosed is an item that acquires characteristic information indicating mecha-chuck characteristics and component information related to the component to be gripped by the mecha-chuck, and by referencing the characteristic information and the component information, determines whether the mecha-chuck is suitable for gripping the component or mounting on the board.
Patent literature 1: JP2008-108919

BRIEF SUMMARY

However, with the technology disclosed in patent literature 1, the determination is only for whether the tool to be used is suitable for gripping or mounting the component, tool selection must be performed by users themselves. In particular, in a case in which multiple configuration members such as a main body, claws, pushers (pushing members), and the like must be combined to make a tool for gripping and mounting a leaded component, users must find an optimal combination from a large number of possible combinations, meaning that the burden on users is very large.

An object of the present disclosure is to enable a user to efficiently find appropriate configuration members or a combination thereof for a tool for gripping and mounting a leaded component on a board in a case in which the tool is made from a combination of multiple configuration members.

The present disclosure uses the following means to achieve the above object.

A tool searching device of the present disclosure is used when gripping a leaded component and mounting the leaded component on a board by using a tool formed from multiple configuration members, for searching for the configuration member or a combination of the configuration members appropriate for gripping or mounting the leaded component on the board, the tool searching device including:

a memory section configured to memorize multiple configuration member information related to each of the multiple configuration members, linked to size-related information that relates to a size of a component main body of the leaded component or lead-related information that relates to a lead of the leaded component;

an acquiring section configured to acquire the size-related information or the lead-related information;

a search section configured to search the configuration member or the combination of the configuration members from the memory section using the acquired size-related information or the acquired lead-related information as a search term; and an output section configured to output a search result.

A tool searching device of the present disclosure is provided with a memory section configured to memorize multiple configuration member information related to each of the multiple configuration members, linked to size-related information that relates to a size of a component main body of the leaded component or lead-related information that relates to a lead of the leaded component. Also, a tool searching device of the present disclosure acquires size-related information or lead-related information, searches from the memory section the configuration member information or a combination of the configuration member information using the acquired size-related information or the acquired lead-related information as a search term, and outputs the search result. Thus, a user is able to efficiently find a configuration member or a combination of the configuration members appropriate for gripping a leaded component or mounting the leaded component on a board by inputting the size-related information or the lead-related information.

In such a tool searching device of the present disclosure, the configuration members may include at least one of a tool main body, and a claw attached to the tool main body and capable of performing a gripping action, the memory section may memorize tool main body information related to the tool main body and claw information related to the claw as the multiple configuration member information, linked to the size-related information or the lead-related information, and the search section may search for the tool main body information or the claw information or a combination of the tool main body information and the claw information using the acquired size-related information or the acquired lead-related information as the search term. Accordingly, a user is able to efficiently find tool main body information, or claw information, or a combination thereof by inputting size-related information or lead-related information.

In such a tool searching device of the present disclosure, the configuration members may further include a pushing member attached to the tool main body and configured to push a component upper surface of the leaded component, the memory section may further memorize pusher member-related information related to the pusher member as the multiple configuration members, linked to upper-surface-form-related information related to an upper surface form of the leaded component, the acquiring section may be configured to further acquire the upper-surface-form-related information, and the search section may be configured to search the tool main body information, the claw information or the pushing member information, or a combination of the tool main body information and the claw information or the pushing member information, using the acquired size-related information or the acquired lead-related information and the upper-surface-form-related information as the search term. Accordingly, the user is able to efficiently find the tool main body information, the claw information, or the pushing member information, or a combination thereof, by inputting the size-related information or the lead-related information and the upper-surface-form-related information.

In such a tool searching device of the present disclosure, the tool may be configured to grip a leaded component supplied by a component supply device, the memory section may be configured to memorize attachment-height-related information related to an attachment height when attaching the pushing member to the tool main body, linked to supply-height-related-related information related to a supply height when the leaded component is supplied, the acquiring section may be configured to further acquire the supply-height-related information, and the search section may be configured to search the tool main body information, the claw information, the pushing member information, or the attachment-height-related information, or a combination thereof, using the acquired size-related information or the acquired lead-related information, the upper-surface-formrelated information, and the supply-height-related information as the search term. Accordingly, the user is able to know the attachment height of a pushing member by inputting supply-height-related information.

Also, in a tool searching device of the present disclosure, the memory section may be configured to, corresponding to each of the combinations of the configuration member information, memorize tool identification information for identifying the tools that make up the combination, and the output section may output the multiple configuration member information combination searched by the search section, and the tool identification information corresponding to the combination. Accordingly, it is easy to manage combinations of searched multiple configuration member information.

BRIEF DESCRIPTION OF DRAWINGS

FIG. 10 shows an example of a chuck main body type and claw type deciding table.
FIG. 11 shows an example of a pusher type deciding table.
FIG. 12 shows an example of a pusher height deciding table.
FIG. 13 shows an example of a tool ID deciding table.
FIG. 14 shows an example of an output screen.
FIG. 15 shows an example of an alternative guidance screen.
FIG. 16 shows an example of an alternative input screen.

DESCRIPTION OF EMBODIMENTS

An embodiment of the present disclosure is described below.

Figure 1:
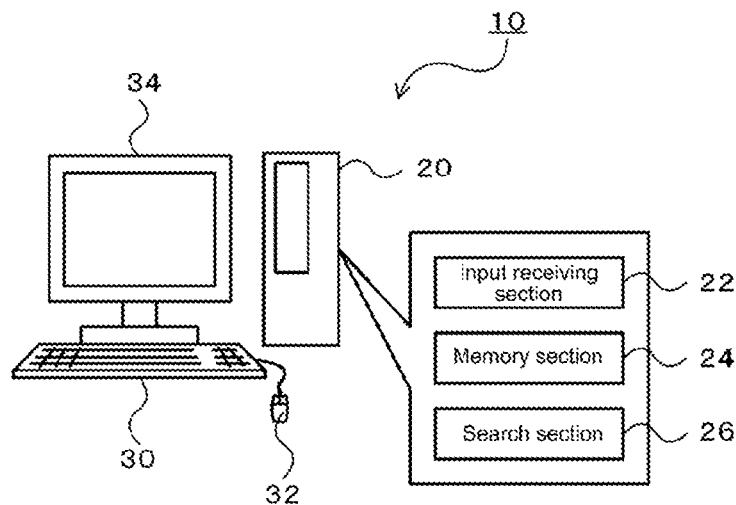
FIG. 1 shows an outline of the configuration of an embodiment, tool searching device 10.
Figure 2:
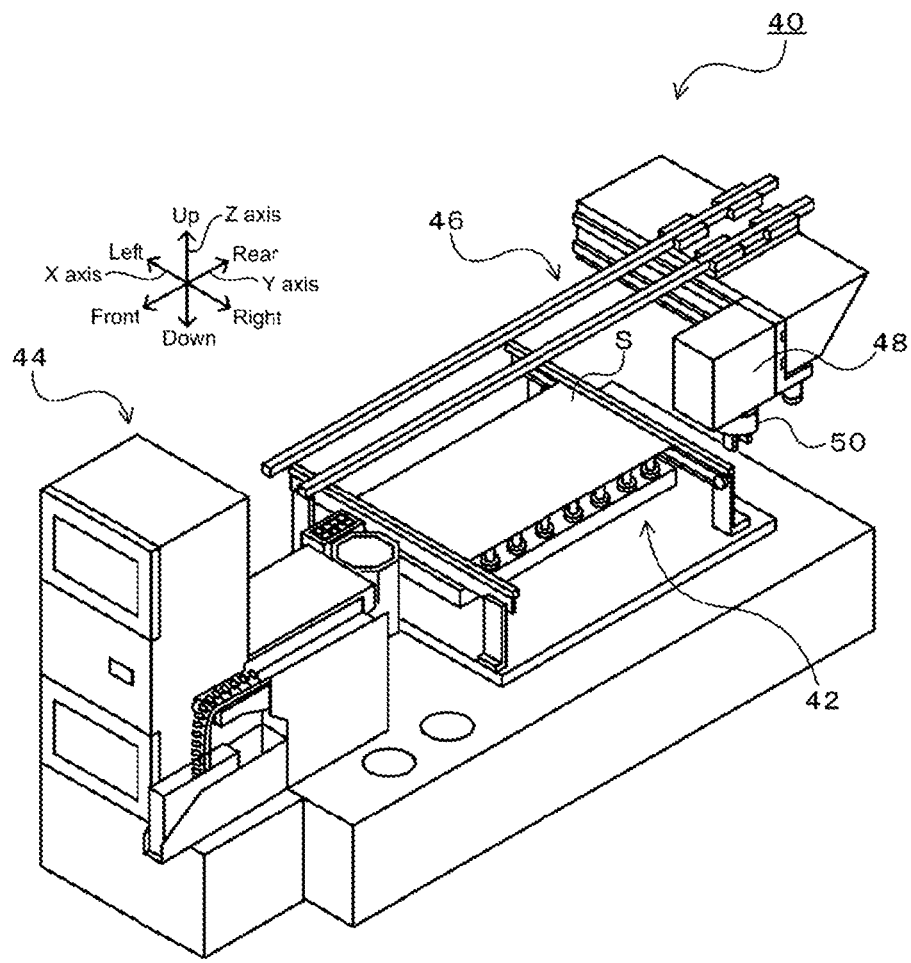
FIG. 2 shows the overall configuration of component mounter 40.
Figure 3:
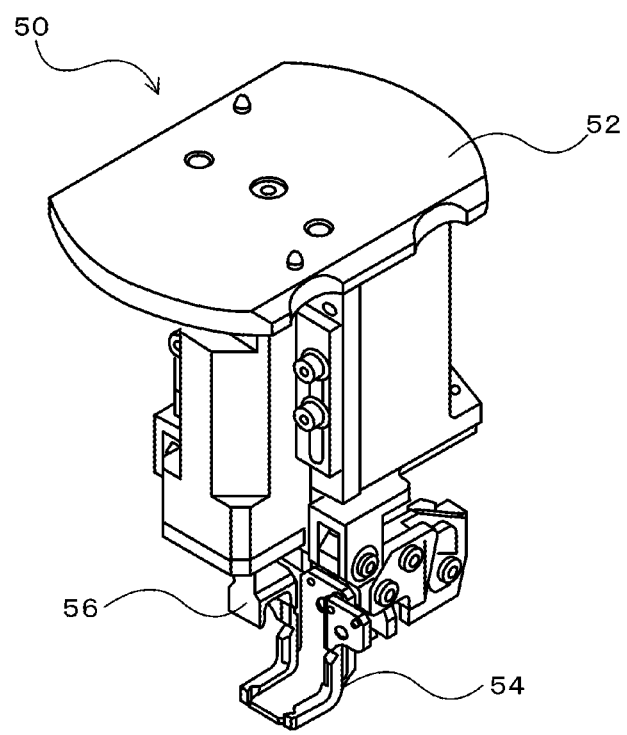
FIG. 3 shows an external view of mecha-chuck 50.

FIG. 1 shows the overall configuration of an embodiment, tool searching device 10; FIG. 2 shows the overall configuration of component mounter 40; FIG. 3 shows an external view of mecha-chuck 50.

As shown in FIG. 1, an embodiment, tool searching device 10, is provided with a general purpose computer 20 connected to an input device such as keyboard 30 and mouse 32 and an output device such as liquid crystal display 34, input receiving section 22, memory section 24, and search section 26. A tool searching program for searching for an optimal tool from multiple types of tools is installed in memory section 24. Search section 26, when the tool searching program is started, receives inputs of required information from a user via input receiving section 22 and searches for a tool using the received information as a key, then outputs the search result to an output device.

The tool is mechanical chuck (mecha-chuck) 50 for gripping and mounting a leaded component as the component in component mounter 40 that mounts components on a board. Note that, as shown in FIG. 2, component mounter 40 may be provided with board conveyance device 42 that conveys boards S, component supply device 44 that supplies components, head 48 that uses mecha-chuck 50 to grip a component (leaded component) supplied by component supply device 44 and mount the component on the conveyed board S, and moving device 46 that moves head 48.

Figure 4:
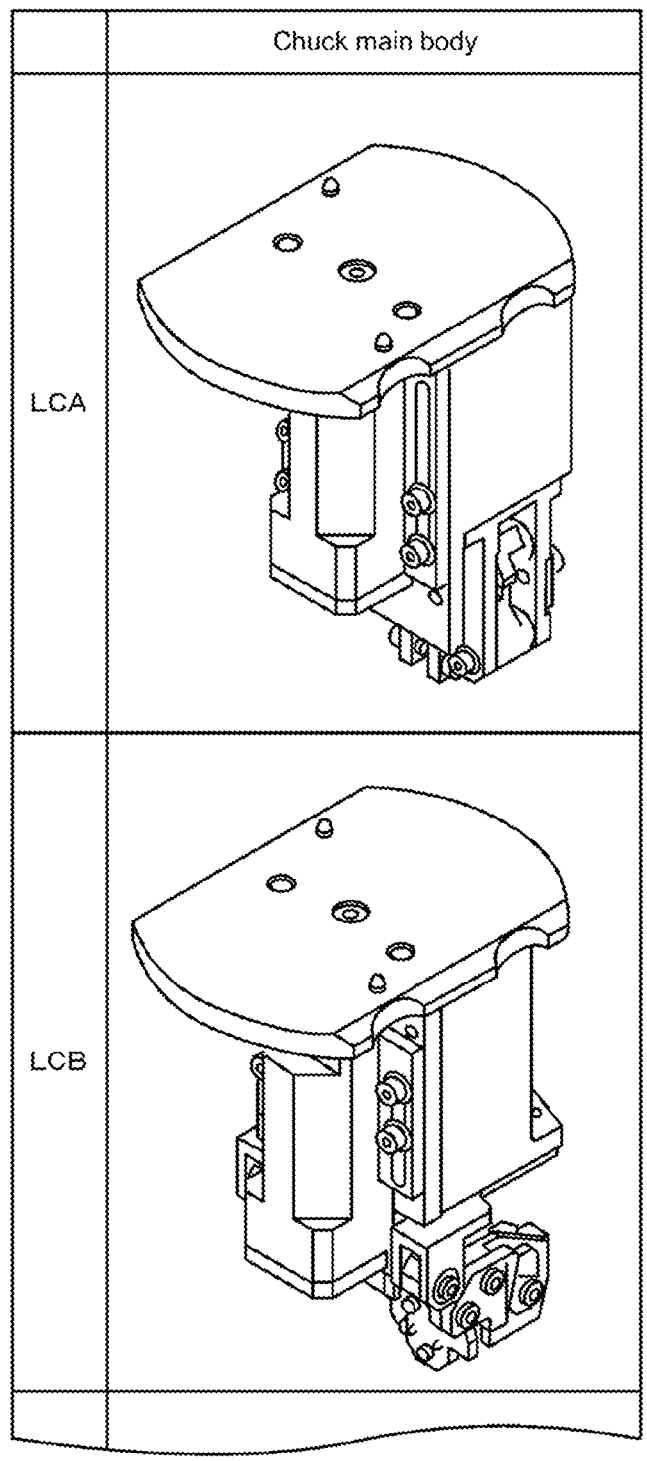
FIG. 4 illustrates variations of chuck main bodies.
Figure 5:
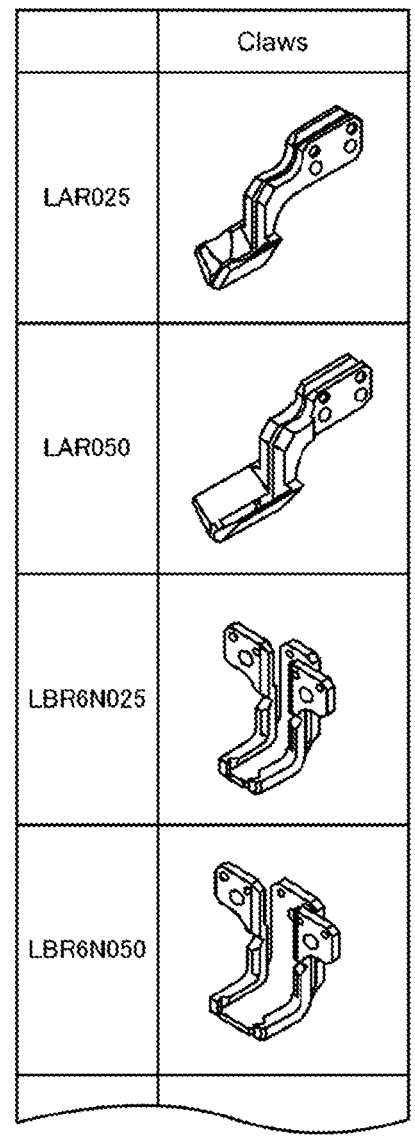
FIG. 5 illustrates variations of claws.
Figure 6:
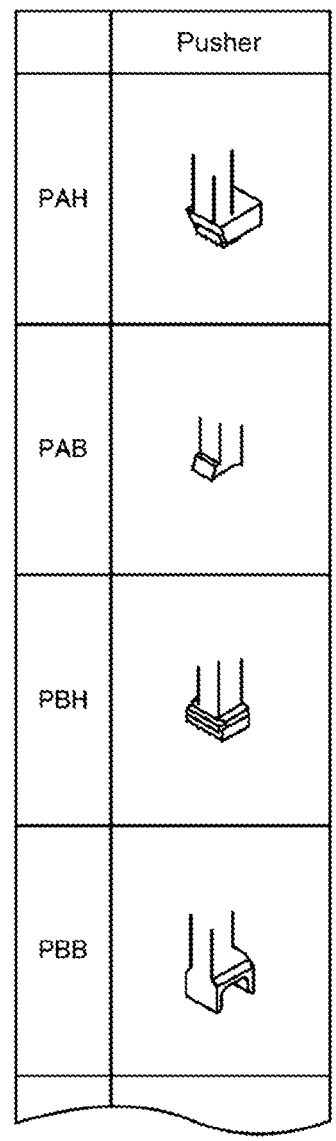
FIG. 6 illustrates variations of pushers.

As shown in FIG. 3, mecha-chuck 50 is configured from a combination of chuck main body 52, claw 54, and pusher 56, and is removably attached to head 50. In such a tool searching device of the present disclosure, the configuration members may further include a pushing member attached to the tool main body and configured to push a component upper surface of the leaded component, the memory section may further memorize pusher member-related information related to the pusher member as the multiple configuration members, linked to upper-surface-form-related information related to an upper surface form of the leaded component, the acquiring section may be configured to further acquire the upper-surface-form-related information, and the search section may be configured to search the tool main body information, the claw information or the pushing member information, or a combination of the tool main body information and the claw information or the pushing member information, using the acquired size-related information or the acquired lead-related information and the upper-surface-form-related information as the search term. Accordingly, tool searching device 10 is for searching for an optimal combination from the multiple types of chuck main bodies, claws, and pushers that are each prepared. FIG. 4 illustrates types of chuck main bodies; FIG. 5 illustrates types of claws; FIG. 6 illustrates types of pushers. Note that, FIGS. 4 to 6 are items configured for gripping a radial component as a leaded component.

A chuck main body functions as a chuck that can grip a leaded component by being attached to head 48 in a state with a claw and a pusher attached. Multiple types of chuck main bodies (such as "LCA" or "LCB" shown in FIG. 4) are prepared in accordance with the size or the like of the leaded component to be gripped (the size in the tape feeding direction, the size in a direction perpendicular to the tape feeding direction). Here, "LCA" is appropriate for gripping a relatively small leaded component and "LCB" is appropriate for gripping a relatively large leaded component.

A claw is attached to a chuck main body, and is an air-driven type opening and closing member capable of gripping a leaded component and mounting the gripped leaded component on a board S by performing opening and closing operations. Multiple types of claws (such as "LAR025", "LAR050", LBR6N025", and "LBR6N050" shown in FIG. 5) are prepared in accordance with the types of chuck main bodies to be used, the lead pitches, the lead diameters, and the like. Here, "LAR025" and "LAR050" are claws that can be used when "LCA" is used as the chuck main body. "LAR050" is appropriate for gripping leaded components with a larger lead pitch than "LAR025". Also, although not shown, there is also "LAR075", which is appropriate for gripping leaded components with a larger lead pitch than "LAR050" (the larger the three-digit number at the end of the name, the larger the supported lead pitch). Also, "LBR6N025" and "LBR6N050" are claws that can be used when "LCB" is used as the chuck main body. "LBR6N050" is appropriate for gripping leaded components with a larger lead pitch than "LBR6N025". Also, although not shown, there is also "LBR6N075", which is appropriate for gripping leaded components with a larger lead pitch than "LBR6N050" (the larger the three-digit number at the end of the name, the larger the supported lead pitch). Also, although not shown, there are also "LBR8N025", "LBR8N050", "LBR8N075", and the like, which are appropriate for gripping leaded components with a larger lead diameter (the larger the number immediately after "LBR" in the name, the larger the supported lead diameter).

A pusher is attached to a chuck main body, and is an air-driven type pushing member that pushes on a component upper surface when the leaded component is being mounted. Multiple types of pushers (such as "PAH", "PAB", "PBH", and "PBB" shown in FIG. 6) are prepared in accordance with the form of the component upper surface, the types of chuck main bodies to be used, and the like. Here, "PAH" and "PBH" are pushers used for components with a flat component upper surface (such as aluminum electrolytic capacitors), while "PAB" and "PBB" are pushers used for longitudinal components (such as longitudinal resistors). Also, although not shown, there are also "PAC" and "PBC" used for components such as disc-type or film-type components, "PAD" and "PBD" used for round-topped components (such as LEDs), and the like. Also, there are pushers that can or cannot be used, depending on the type of chuck main body. Specifically, "PAH", "PAB", "PAC", and "PAD" can be used with an "LCA" type chuck main body, and "PBH", "PBB", "PBC", and "PBD" can be used with an "LCB" type chuck main body.

Figure 7:
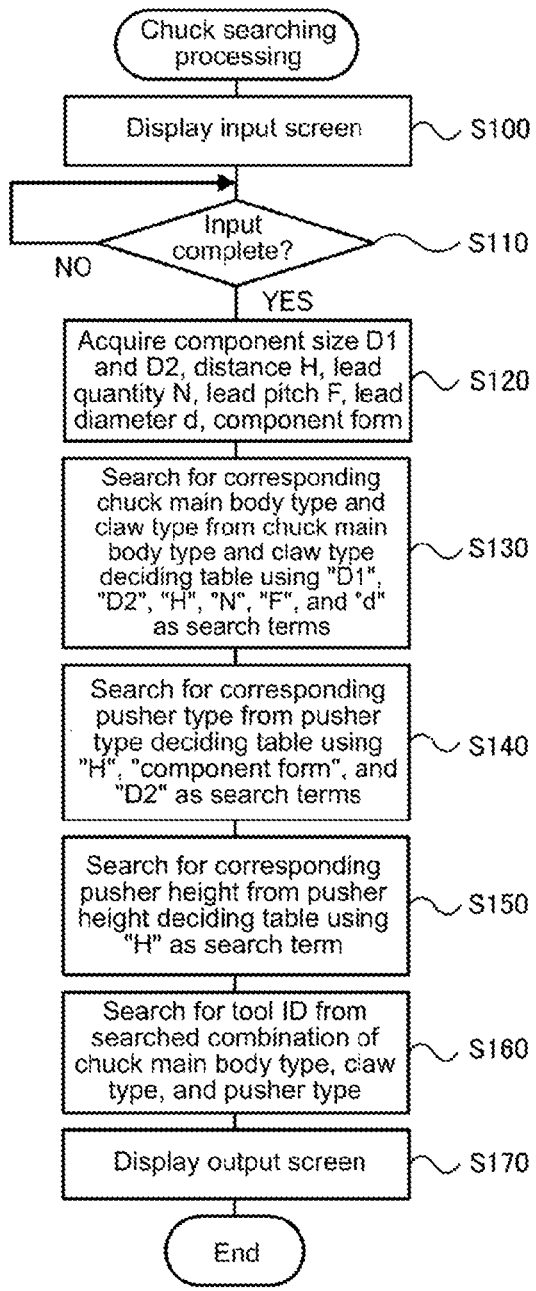
FIG. 7 is a flowchart showing an example of chuck searching processing.

Described next is operation of the present embodiment, tool searching device 10, in particular, processing for searching for a chuck appropriate for gripping a radial component as a leaded component and mounting the component on a board S. FIG. 7 is a flowchart showing an example of chuck searching processing performed by search section 26. This processing is performed when a click of a "Start input" button on a guidance screen displayed on liquid crystal display 34 is received by input receiving section 22 in a state with the chuck searching program running.

Figure 8:
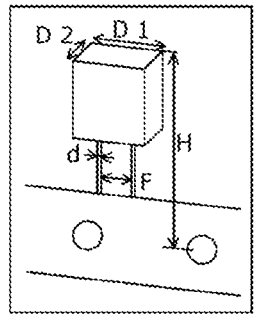
FIG. 8 shows an example of a guidance screen.

FIG. 8 is an example of a guidance screen. As shown, the guidance screen is configured from an input item display section ("First step") that displays a list of input items to be entered by a user, and an explanation section ("Items to prepare") that explains details of the input items. Note that, as input items, in the present embodiment, there are: size of component in the tape feeding direction (D1); size of component in a direction perpendicular to the tape feeding direction (D2); lead diameter (d); lead pitch (F); distance from center of tape feeding hole to highest position of component, that is, the supply height (H) when a radial component is supplied by component supply device 44; and component form (component upper surface is flat, disc-type, film-type, longitudinal resistor, or round-topped). Note that, although not shown in FIG. 8, there are additional input items such as lead quantity (N), and whether processing (cut and clinch) is to be performed on leads below the board after the radial component has been mounted on board S ("yes" or "no" for cut and clinch).

Figure 9:
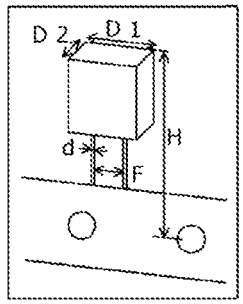
FIG. 9 shows an example of an input screen.

When the chuck searching processing is performed, search section 26, first, displays the input screen on liquid crystal display 34 on which are displayed items that require input from a user (step S100), and waits for a user to enter the items (S110). FIG. 9 shows an example of an input screen. As shown, displayed on the input screen are: input fields for each of "Component name", "D1", "D2", "d", "F", "H", "Component form", "Lead quantity N", "Cut and clinch required", and "Other information" as component information; a "Clear" button for clearing entered component information; and a "Register" button for registering entered component information. Note that, "Component form" can be entered, for example, by selecting from a drop-down list that displays options ("Component upper surface is flat", "Disc-type", "Film-type", "Longitudinal resistor", and "Round-topped"). Also, "Cut and clinch required" can be entered, for example, by selecting from a drop-down list that displays options ("Yes" and "No"). A user can enter the component information in each field using keyboard 30, and register the entered component information in a list (table) by clicking the "Register" button.

Also, a component information list (table) that displays a list of registered component information is displayed on the input screen. Displayed around the component information list (table) are: a "Back" button for returning to the previous screen (the above guidance screen); a "Save table" button for saving the component information displayed in the component information list (table); a "Clear component" button for deleting the component information displayed in the component information list (table); and a "Start search" button for searching for a tool configuration based on the component information displayed in the component information list (table). Search section 26, when the "Start search" button is clicked in a state with component information registered in the component information list (table), determines that input in step S110 is complete.

Search section 26, upon determining that input is complete, acquires each of the input items such as component sizes D1 and D2, distance H, lead quantity N, lead pitch F, lead diameter d, and component form from the entered component information (step S120). Then, search section 26 searches for a combination of chuck main body type and claw type from the chuck main body type and claw type deciding table using "N", "D1", "D2", "d", "F", and "H" from the acquired entered items as search terms (step S130). FIG. 10 shows an example of a chuck main body type and claw type deciding table. As shown, the chuck main body type and claw type deciding table shows the corresponding "N", "D1", "D2", "d", "F", and "H" values for each combination of chuck main body type and claw type. For example, if "D1" is 10.00 mm, "D2" is 5.00 mm, "d" is 0.50 mm, "F" is 5.00 mm, and "H" is 32.00 mm, as shown in FIG. 10, "LCB" and "HBR6N050" is selected as the combination of chuck main body type and the claw type.

Continuing, search section 26 searches for the pusher type from the pusher type deciding table using "H", "Component form", and "D2" from the entered items and the chuck main body type selected in step S130 as search terms (step S140). FIG. 11 shows an example of a pusher type deciding table. As shown, the pusher type deciding table shows the corresponding "H", "Component form", "D2", and "Chuck main body type" for each pusher type. For example, if "H" is 32.00 mm, "Component form" is component upper surface is flat, "D2" is 5.00 mm, and "LCB" is selected as the chuck main body type, "PBH" is selected as the pusher type.

Then, search section 26 searches the pusher height from the pusher height deciding table using "H" from the acquired entered items as a search term (step S150). FIG. 12 shows an example of a pusher height type deciding table. As shown, the pusher height deciding table shows the corresponding "H" values for each pusher height. For example, if "H" is 32.00 mm, "10" is selected as the pusher height.

Search section 26, when searching in this manner for a combination of a chuck main body type, a claw type, a pusher type, and a pusher height, searches for the tool ID from the search result combinations (step S160), displays the output screen (step S170), and ends chuck searching processing.

FIG. 13 shows an example of a tool ID deciding table. As shown, the tool ID deciding table is a table in which specific IDs are assigned to all the possible combinations of chuck main body types, claw types, and pusher types. For example, "7FBHCA" is selected as the tool ID when the chuck main body type is "LCB", the claw type is "HBR6N050", and the pusher type is "PBH".

FIG. 14 shows an example of an output screen. As shown, displayed on the output screen is a tool configuration list (table) that contains: "No." for indicating the number of the item in the table; "Tool ID" for identifying the search tool configuration (chuck main body type, claw type, and pusher type); "Issue target" indicating whether the tool is an issue target for a 2D code of the tool ID; "Serial number"; "Chuck main body"; "Claw type"; "Pusher type"; and "Pusher height". Note that, "Issue target" can be entered, for example, by selecting from a drop-down list that displays options ("Yes" and "No"). Also, displayed above the tool configuration list (table) are: a "Back" button for returning to the previous screen (input screen); an "Issue 2D code button" for issuing 2D codes of the tool configurations for which issuing applies in the tool configuration list (table); a "Save tool configuration button" for saving the tool configuration displayed in the tool configuration list (table); and a "Clear tool configuration table" button for clearing the tool configuration list (table). Note that, issuing of 2D codes can be performed by clicking the "Issue 2D codes" button in a state with "Yes" selected for "Issue target" of tool configurations for which it is desired to issue a 2D code from the tool configurations displayed in the tool configuration list (table). Tool searching device 10 of the present embodiment is connected to a printer, which is not shown, and when issuing of 2D codes is requested, outputs a print job to the printer so as to print the requested 2D code.

A user, upon confirming the tool configurations displayed in the tool configuration list (table) on the output screen, prepares and combines the required chuck main bodies, claws, and pushers, and by adjusting the pusher to the indicated height, creates a chuck that can be used to grip the target radial component. Note that, the 2D code is a readable code for identifying the tool (chuck) used by component mounter 40, and is attached to the tool.

Correspondences between main constituent elements of the embodiments and main constituent elements of the disclosure will be clarified here. Chuck main body 52, claw 54, and pusher 56 correspond to a "configuration member", mecha-chuck 50 corresponds to a "tool", memory section 24 corresponds to a "memory section", input receiving section 22 corresponds to an "acquiring section", search section 26 corresponds to a "search section", and output device (liquid crystal display) 34 corresponds to an "output section". Also, a chuck main body corresponds to a "tool main body", a claw corresponds to a "claw", and a pusher corresponds to a "pushing member".

Tool searching device 10 of the present embodiment described above memorizes the chuck main body type and claw type deciding table in advance on memory section 24, receives input of information related to the size of the component main body such as component sizes D1 and D2, and information related to leads such as lead pitch F and lead diameter d, and searches for the combination of chuck main body type and claw type from the chuck main body type and claw type deciding table using the received information as search terms. Accordingly, tool selection that previously required knowledge can now be performed automatically. That is, if a user simply prepares a number of chuck main bodies and claws, it is possible to combine these for use by using tool searching device 10.

Further, tool searching device 10 of the present embodiment also memorizes a pusher type deciding table in advance on memory section 24, receives input of information such as the upper surface form (component form) of the leaded component, and searches for the pusher type from the pusher deciding table using the entered information as a search term. Accordingly, it is possible to automatically select the chuck main body type, claw type, and pusher type when using a chuck main body with a pusher attached. Further, it is possible to search together with information required for adjusting the pusher height when attaching the pusher to the chuck main body using the pusher height deciding table, which further increases the convenience.

Meanwhile, it goes without saying that the disclosure is not limited to the above-mentioned embodiment and various embodiments may be applied within the technical scope of the disclosure.

For example, in an embodiment above, in addition to the pusher type, it is also possible to search the pusher height for when attaching the pusher to the chuck main body, but it is not essential to search for the pusher height.

Also, in an embodiment above, it is possible to search for a combination of chuck main body type, claw type, and pusher type, but it is not essential to search for a combination of all three, it is sufficient to search for a combination of any two of the three, or to search for just one of the three. For example, it is possible to search for a combination of just the chuck main body type and the claw type.

Also, in an embodiment above, a tool ID is assigned to combinations of chuck main body type, claw type, and pusher type, but the configuration is not limited to this, an ID may be assigned to each tool configuration (chuck main body, claw, pusher), and each may be managed individually.

Figure 16:
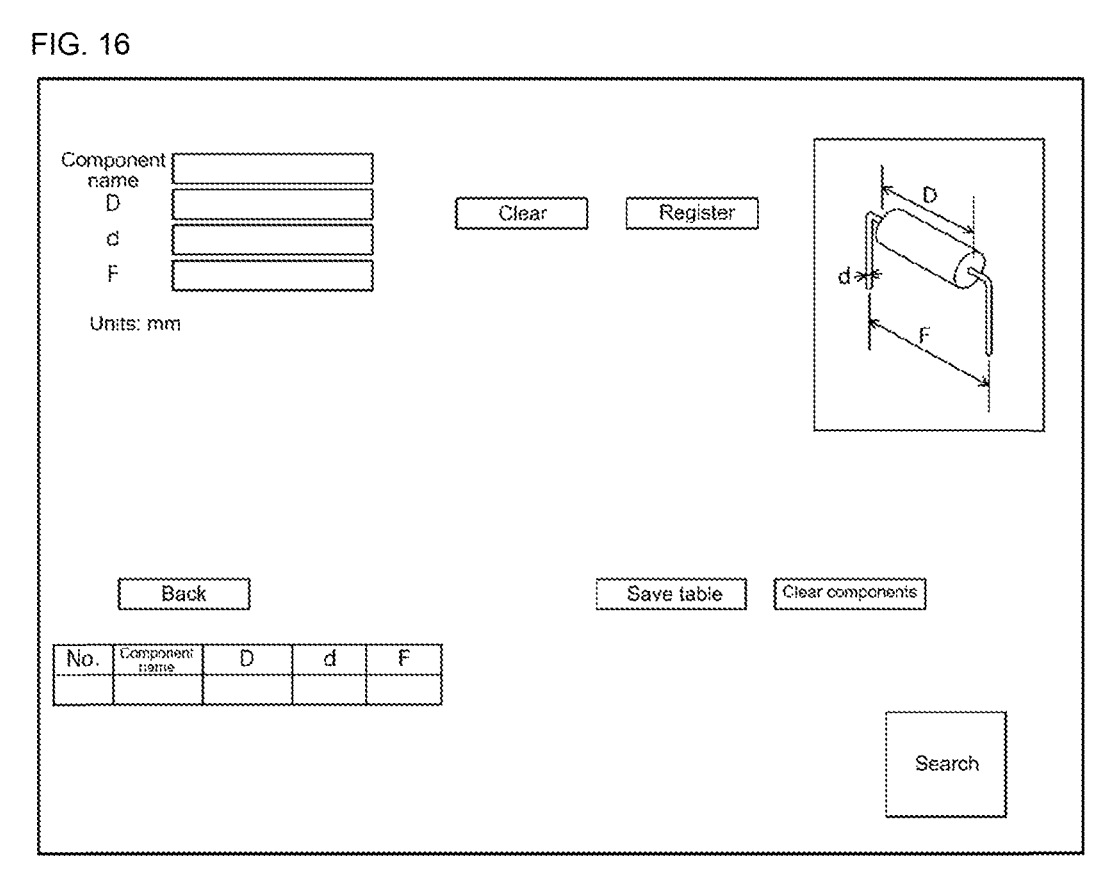

Also, in an embodiment above, descriptions are given of tool searching device 10 applied to searching for a tool appropriate for gripping and mounting a radial component on a board S, but the configuration is not limited to this, and may be applied to various other leaded components, such as being applied to searching for a tool appropriate for gripping and mounting an axial component on a board S. Note that, in a case of applying to searching for a tool appropriate for gripping and mounting an axial component on a board S, the guidance screen of FIG. 15 may be used instead of the guidance screen of FIG. 8, and the input screen of FIG. 16 may be used instead of the input screen of FIG. 9. Note that, as input items of component information for selecting a chuck to be used for an axial component, items such as size of component in a lengthwise direction (D), lead diameter (d), and lead pitch (F) may be used.

INDUSTRIAL APPLICABILITY

The present disclosure may be applied to the industrial field of tool searching devices and the like.

REFERENCE SIGNS LIST

10: tool searching device; 20: computer 22: input receiving section; 24: memory section; 26: search section; 30: keyboard; 32: mouse; 34: liquid crystal display; 40: component mounter 42: board conveyance device; 44: component supply device; 46: moving device; 48: head; 50: mechanical chuck (mecha-chuck); 52: chuck main body; 54: claw; 56: pusher, S: board

The invention claimed is:

1. A tool searching device, which is used when gripping a leaded component and mounting the leaded component on a board by using a tool formed from multiple configuration members, for searching for the configuration member or a combination of the configuration members appropriate for gripping or mounting the leaded component on the board, the tool searching device comprising:
- a memory section configured to memorize multiple configuration member information related to each of the multiple configuration members, linked to size-related information that relates to a size of a component main body of the leaded component or lead-related information that relates to a lead of the leaded component;
- an acquiring section configured to acquire the size-related information or the lead-related information;
- a search section configured to search the configuration member or the combination of the configuration members from the memory section using the acquired size-related information or the acquired lead-related information as a search term; and
- an output section configured to output a search result.

2. The tool searching device according to claim 1, wherein the configuration members include at least one of a tool main body, and a claw attached to the tool main body and capable of performing a gripping action,
the memory section memorizes tool main body information related to the tool main body and claw information related to the claw as the multiple configuration member information, linked to the size-related information or the lead-related information, and
the search section searches for the tool main body information or the claw information or a combination of the tool main body information and the claw information using the acquired size-related information or the acquired lead-related information as the search term.

3. The tool searching device according to claim 2, wherein the configuration members further include a pushing member attached to the tool main body and configured to push a component upper surface of the leaded component,
the memory section is further configured to memorize pusher member-related information related to the pusher member as the multiple configuration members, linked to upper-surface-form-related information related to an upper surface form of the leaded component, the acquiring section is configured to further acquire the upper-surface-form-related information, and
the search section is configured to search the tool main body information, the claw information or the pushing member information, or a combination of the tool main body information and the claw information or the pushing member information, using the acquired size-related information or the acquired lead-related information and the upper-surface-form-related information as the search term.

4. The tool searching device according to claim 3, wherein the tool is configured to grip a leaded component supplied by a component supply device,
the memory section memorizes attachment-height-related information related to an attachment height when attaching the pushing member to the tool main body, linked to supply-height-related-related information related to a supply height when the leaded component is supplied,
the acquiring section is configured to further acquire the supply-height-related information, and
the search section is configured to search the tool main body information, the claw information, the pushing member information, or the attachment-height-related information, or a combination thereof, using the acquired size-related information or the acquired lead-related information, the upper-surface-form-related information, and the supply-height-related information as the search term.

5. The tool searching device according to claim 1, wherein the memory section is configured to, corresponding to each of the combinations of the configuration member information, memorize tool identification information for identifying the tools that make up the combination, and
the output section outputs the multiple configuration member information combination searched by the search section, and the tool identification information corresponding to the combination.

* * * * *